United States Patent [19]

Estes et al.

[11] Patent Number: 4,801,507
[45] Date of Patent: Jan. 31, 1989

[54] ARYLSILOXANE/SILICATE COMPOSITIONS USEFUL AS INTERLAYER DIELECTRIC FILMS

[75] Inventors: William E. Estes, Pittsboro, N.C.; John H. Deatcher, Lake Peekskill, N.Y.; George E. Whitwell, Campbell Hall, both of N.Y.

[73] Assignee: Akzo American Inc., New York, N.Y.

[21] Appl. No.: 69,088

[22] Filed: Jul. 2, 1987

[51] Int. Cl.$^4$ ............................................... B32B 9/06
[52] U.S. Cl. ...................................... 428/450; 357/72; 437/235; 437/243; 528/39; 528/43
[58] Field of Search ................... 528/43, 39; 428/450; 357/72; 437/235, 243

[56] References Cited

U.S. PATENT DOCUMENTS

| | | | |
|---|---|---|---|
| 2,383,827 | 8/1945 | Sprung | 528/43 |
| 2,486,162 | 10/1949 | Hyde | 528/43 |
| 3,162,614 | 12/1964 | Katchman | 260/46.5 |
| 3,294,738 | 12/1966 | Krantz | 260/46.5 |
| 3,944,520 | 3/1976 | Andrianov et al. | 260/46.5 R |
| 4,349,609 | 9/1982 | Takeda et al. | 428/429 |
| 4,485,130 | 11/1984 | Lampin | 528/39 |
| 4,600,685 | 7/1986 | Kitakohji et al. | 430/313 |
| 4,626,556 | 12/1986 | Nozue et al. | 528/43 |
| 4,663,414 | 5/1987 | Estes et al. | 528/30 |

OTHER PUBLICATIONS

The Merk Index, 1976, p. 8238. (ninth edition).
Chemical Abstracts, vol. 97 (1982), 216307f.
Chemical Abstracts, vol. 101 (1984), 7259d.
Chemical Abstracts, vol. 104 (1986), 68920w.

*Primary Examiner*—Melvyn I. Marquis
*Attorney, Agent, or Firm*—Richard P. Fennelly; Louis A. Morris

[57] ABSTRACT

Oligomers and polymers, useful as interlayer dielectric films, are formed by the co(hydrolysis/condensation) of an aryl group-containing trifunctional silanetriol or derivative with a tetrafunctional silicic acid compound. The respective tri- and tetrafunctional substituents on either silicon compound reaction are chosen so that they act as reactants in condensation oligomerization or polymerization reactions with the substituents on the other reactant.

9 Claims, No Drawings

ARYLSILOXANE/SILICATE COMPOSITIONS USEFUL AS INTERLAYER DIELECTRIC FILMS

BACKGROUND OF THE INVENTION

This invention concerns the creation of dielectric layers or doped polymeric layers for electronic applications, particularly multilevel metallized circuits.

The prior art has formed insulating layers on silicon semiconductor substrates by chemical vapor deposition techniques. In such procedures a volatile silicon compound is decomposed and oxidized in the gas phase and then deposited on the substrate.

Unfortunately, this traditional chemical vapor deposition technique will result in increased fabrication problems for future integrated circuits with perhaps 3, 5, 10, or more interconnection layers. The inability of vapor systems to planarize the surface they are insulating will be an increasing problem, particularly to photolithographic steps in the fabrication process. Moreover, the vapor deposited doped silicon oxide interlayers are brittle and must be protected from water.

Ladder-type organosiloxanes have been described as useful for forming interlayer dielectric films (U.S. Pat. No. 4,600,685). These are apparently formed by hydrolytic polycondensation of organotrihalosilanes such as phenyltrichlorosilane. Doping of interlayer dielectric compositions is not described therein.

Spin-on deposition has been proposed as an application method by Chang et al. in a paper presented to The Electrochemical Society in mid-May of 1985 in Toronto, Canada.

U.S. Pat. No. 4,663,414 to W. E. Estes et al. describes doped spin-on polymers of a silsesquioxane-based copolymer type.

A need exists for improved polymers suitable for use as interlayer dielectrics.

SUMMARY OF THE INVENTION

This invention is a curable arylsiloxane/silicate or doped arylsiloxane/silicate oligomeric or polymeric composition suitable for spin-casting a dielectric layer.

This invention is also a solution comprising a curable arylsiloxane/silicate or curable doped arylsiloxane/silicate oligomeric or polymeric composition suitable for spin-casting a dielectric layer.

This invention is also a method of making a cured arylsiloxane/silicate oligomers or polymers or cured doped arylsiloxane/silicate oligomers or polymers by treating the oligomers or polymers taught by the invention with heat.

This invention is also a method of making an improved VLSIC article using the arylsiloxane/silicate oligomers or polymers, in either doped or undoped form, of this invention.

Finally, this invention is an improved VLSIC article using as an interlayer dielectric the undoped or doped arylsiloxane/silicate oligomers or polymers of this invention.

The present invention relies upon the co(hydrolysis/condensation) of an arylsilanetriol or derivative thereof with a silicic acid compound. The invention, in essence, relies upon the formation of polymeric or oligomeric units as a result of the hydrolysis and condensation of a trifunctional aryl silicon compound (e.g., a silane) with a tetrafunctional derivative of silicic acid (e.g., a tetraalkyl orthosilicate).

DETAILED DESCRIPTION OF THE INVENTION

The arylsiloxane/silicate oligomers or polymers of the invention must meet a variety of criteria. Adhesion, thermal stability, low dielectric constant are necessary properties. Some of these properties are shared by other organo-silicon resins. However, there is considerable difficulty in obtaining a resin that has the required solubility and stability. Solubility is a necessary property since the oligomer or polymer is desirably spin-cast from a solution. Moreover, the oligomer or polymer solution must be filtered to remove particulate matter. Solubility and viscosity considerations are also important for filterability and selective removal of cured or partially cured films. Reproducible viscosity is important for consistent planarization by a spin-on procedure. Stability of the oligomer or polymer includes the important characteristic of not forming granules, particles or other non-uniform attributes during spin-casting, curing, or VLSIC fabrication. All of the above demanding conditions require a careful balance of molecular structure to achieve the desired results.

PREPARATION OF THE MIXTURE OF OLIGOMERS OF THIS INVENTION

As stated above, the oligomers or polymers of the present invention are formed by the co(hydrolysis/condensation) of an aryl group-containing trifunctional silanetriol or derivative thereof with a tetrafunctional silicic acid compound. The aryl group on the trifunctional silane reactant can be phenyl, optionally substituted with substituents which do not interfere with the co(hydrolysis/condensation) reaction.

The aryl-group containing trifunctional silanetriol or derivative thereof has the general formula

where Ar is a substituted or unsubstituted phenyl group and Z is a group which is capable of participating in the co(hydrolysis/condensation) reaction with the tetrafunctional silicic acid compound to be described below, namely, halogen (X), alkoxy (OR), hydroxy (OH), and the like. Mixed substituents are possible. Hydrolyzed silanetriol, where Z is OH, can also be used.

The tetrafunctional silicic acid compound has the formula $Si(Y)_4$ with Y being chosen to appropriately lead to condensation reaction with the two substituents. Representative Y substituents include alkoxy (OR) and halogen (X).

The condensation reaction forms oligomers and polymers which are relatively rich in siloxane units which are well-known as containing silicon atoms single-bonded to oxygen and so arranged that each silicon atom is linked to four carbon atoms. The compositions of the present invention have a high organic content and yield compositions of good flexibility which are capable of being deposited to form relatively thick films. The aryl substituent (e.g., phenyl) results in good thermal stability for the compositions.

The oligomers or polymers of the present invention yield arylsiloxane/silicate structures of the type shown below:

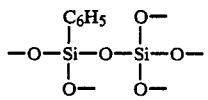

where the ratio of monophenyl substituted silicon atoms to silicon atoms can range from about 0.25 to about 4.0. If desired, doped structures can be produced by use of heteroatomic hydroxy compounds of the formulae (a) $Ar_xM(O)(OR)_y$ or (b) $Ar_xM(OR)_y$, where Ar is aryl (e.g., phenyl), R is hydrogen or alkyl, to introduce heteroatoms in accordance with the formula which follows. If M is phosphorus, for example, in formula (a), x can be 0 to 2 and y can be 3 to 1. If M is boron, in formula (b), x can be 0 or 1 and y can be 3 or 2. For example, in regard to formula (b):

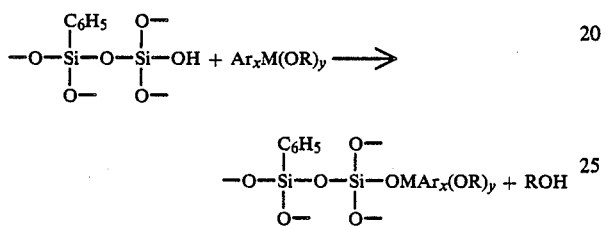

The aryl trifunctional silicon compound is cohydrolyzed with tetrafunctional silicon compound in a mole ratio of the former to the latter of from about 3:1 to about 6:1. The preferred mole ratio is from about 3.5:1 to about 4.5:1, with a ratio of about 4:1 being particularly preferred.

The co(hydrolysis/condensation) reactants may be limited to the trifunctional and tetrafunctional silicon compounds where it is intended to finally produce a non-conductive insulating polymeric layer. However, doped oligomers or polymers may be produced by introducing selected boron or phosphorus compounds into the co(hydrolysis/condensation) reaction, if desired.

Useful reactants for producing doped oligomeric mixtures are organophosphorus and organoboron compounds. Doping compounds are typified by phenylphosphonic acid, triisopropylborate, tributylborate or phenylboron dihydroxide. These doping reactants usually constitute a minor proportion of oligomer forming reactants, e.g., up to about 10% of the entire composition.

The reaction between the trifunctional silicon reactant and the tetrafunctional silicon reactant is generally effected by combining the reactants in the presence of water and an organic solvent such as ether. The resulting hydrolyzed product is cleaned of water and further reacted with doping organoboron or organophosphorus compounds, if desired.

Oligomers or polymers formed by hydrolysis and condensation of phenylhalosilanes may cyclize to give compact cyclic phenylsiloxane structures. Moreover, phenyltrisilanol or phenyltrihalosilanes have a tendency to form cyclic oligomers with undesirable solubility and film forming properties. This invention, in one of its embodiments, teaches an alternative preparation scheme by cohydrolysis and condensation of phenyltrihalosilanes together with a tetraalkyl orthosilicate, such as ethyl silicate. The result of this cohydrolysis and condensation is to lower the stoichiometric proportion of phenyl groups substituted directly on the silicon atoms in the backbone of polymer chain.

The speed polymer of this invention is prepared in a two stage reaction. First, the charge of trifunctional compound, such as phenyl trichlorosilane, is reacted with the tetrafunctional compound, such as ethyl silicate, in a solvent and in the presence of water. Thereafter, the reaction product is further reacted with the doping compound.

The resultant polymers are characterized in having lower phenyl substitution than previously used. Typically, there are phenyl groups on one in four bonds coming from the silicon atom in the polymer chain.

The above condensation reactions of the trifunctional compound (e.g., silanol) and the tetrafunctional compound, (e.g., silicate), may take place in the presence of doping atoms introduced through hetero-condensation reactions. Thus, phosphorus and boron may be included in the polymer structure through the reaction scheme, if desired.

Solutions of Oligomers

The arylsiloxane/silicate mixture of oligomers or polymers prepared according to the invention are intended for eventual use as solutions. Solution of the oligomeric or polymeric mixture of the invention is effected by dissolving the mixture in a suitable organic solvent with optional assistance of mild heat and agitation.

The preferred solvents are non-aqueous systems which are not corrosive to the silicon or other semiconductor base forming the integrated circuit. Suitable solvents are selected from liquid hydrocarbons, alcohols, ketones, aldehydes, and ethers. The concentration of the polymer in the solvent is adjusted so that the polymeric residue after spin-on deposition gives an insulating layer of the desired thickness. Typically, the solvent/polymer compositions of this invention have a polymer concentration of from 15 to 30 weight percent. A particularly preferred solution is described in U.S. Pat. No. 4,758,620, entitled "Blend of Solvent and Arylsiloxane Interlayer Dielectric Materials".

Curing of the Mixture of Oligomers

The curing of the mixture of oligomers of the invention to produce a cured polymer may be done with heat. Typically, the mixture of oligomers absent solvent is heated to about 300° C. to about 500° C. for a period of up to about one hour, preferably 350° C. for 20 minutes in either air or nitrogen. Radiative type infrared heaters are particularly suitable for curing the polymers of the invention.

The determination of a suitable concentration for the polymer is functionally determined by actually applying the polymer composition and measuring the resultant film thickness. This film thickness may then be varied by process parameters such as the speed of rotation during spin-on, polymer concentration and, to a lesser degree, the quantity of polymer composition applied to the surface of the integrated circuit.

Method of Making ILD Films

The mixture of oligomers of the invention is placed on a semiconductor wafer substrate in a manner that assures adhesion and uniformity. The semiconductor substrate material is typically silicon. The process of this invention is particularly suitable for depositing interlayer dielectrics on silicon.

The preferred fabrication method is to deposit a solution of the mixture of oligomers onto a silicon wafer.

The wafer typically has a diameter of 4 to 8 inches. A particularly preferred technique is the "spin-coating" process wherein a uniform film of oligomer mixture is generated by applying a large drop of the formulation to the wafer so as to cover about one-third to one-half of the surface area. Each wafer was then accelerated to a desired angular velocity, which was maintained for 20 seconds. By varying the spin speed, different thicknesses of wet film were obtained. This film thickness decreased approximately 15% during the curing step.

The wet films on the wafer are then heat-cured in situ, by batch and/or continuous methods.

In the batch method, the wafers are dried at 130° C. for a period of 15 to 30 minutes followed by a final cure at 350° C. for 15 to 45 minutes in a standard box furnace. In the preferred continuous method, the wafers are passed through an infrared heating furnace on a conveyor belt.

The invention is illustrated by the following Examples.

EXAMPLE 1

Part A: Preparation of the Polymer

A 3-neck flask is equipped with a reflux condenser, nitrogen shroud and magnetic stirrer. Phenyl trichlorosilane (0.02 mole, 12.2 grams) dissolved in xylene to make 150 ml. of solution was added to the reaction flask. The mixture was treated dropwise with isopropanol (52 grams) during which the evolution of gaseous hydrogen chloride was noted. During the addition of isopropanol the temperature was kept between 20°–30° C. Next, ethyl silicate (Si(OC$_2$H$_5$)$_4$) was added (used 0.05 mole, 10.4 gram). The temperature of the flask was raised to 90° C. and the mixture was treated dropwise with water (25.2 grams) dissolved in isopropanol (10 milliliters). The temperature was maintained at 90° C. for about two hours, then cooled to room temperature. Upon reaching room temperature two layers formed. The organic upper layer was separated and washed with several portions of water until no AgCl precipitated upon testing with AgNO$_3$ solution.

The resulting xylene layer was transferred to a distillation flask. The mixture was distilled to a temperature of 130°–140° C. to remove low boiling materials. Roughly 80 grams of solvents were distilled from the mixture. Roughly 40 grams of pure xylene was added back to the flask to give a clear solution that was roughly 22% by weight of the cohydrolysate.

Part B: Treatment of the Co-hydrolysate Product of Step A with Phenylphosphonic Acid and Isopropyl Borate to Prepare Doped Boro-phosphono-silanols Phenylphosphonic acid (0.8 grams) and triisopropylborate (1.9 grams in 5 grams of isopropanol) were added to the solution of the co-hydrolysate of Part A. The mixture was heated to reflux and the low boiling fraction (alcohol and water) was removed over a period of two hours.

The mixture was divided into equal parts by volume. One part was filtered through a 0.5 micron membrane filter and set aside. The second portion (33 grams) was treated with 0.1 percent by weight of tetramethylammonium hydroxide (TMAH), refluxed for two hours, and the low boiling portion distilled away.

Part C: Coating the Silicon Wafer with the Polymer of Part B

Both of samples B-1 (not treated with TMAH) and B-2 (treated with TMAH) were spun onto two-inch silicon wafers at 5000 revolutions per minute for 20 seconds with a photoresist spinner supplied by Headway Research, Model No. EC-102-NRD. The samples were cured in a nitrogen atmosphere using a Lindberg S1442 tube oven at 350° C. for 20 minutes to produce a hard, shiny film. The thicknesses and refractive indices of the insulating silanol films were determined by ellipsometry and are as follows:

| Sample No. | Thickness (Angstroms) | Refractive Index |
|---|---|---|
| B-1 | 2265 | 1.46 |
| B-2 | 2145 | 1.46 |

EXAMPLE 2

Spin Coating of Silicon Wafers with a Co-hydrolysate of Phenylsiloxane/Silicate Polymer A co-hydrolysate was prepared in a manner similar to Example I, Part A, but having solids content of 25.5 weight percent. This material (not treated further with phenylphosphonic acid or borates) was spun onto wafers at 5000 revolutions per minute for 20 seconds. The resultant polymer film was cured to a hard, shiny film at 350° C. The refractive index was found to be in the range of 1.47 to 1.50 by ellipsometry. The thickness of the film was found to be between 13,600 to 14,200 Angstroms per spin-coat application.

EXAMPLE 3

Alternate Preparation of an Interlayer Dielectric Solution

A three neck flask was equipped with a Dean-Stark trap and condenser, a thermometer for measuring vapor temperature, a magnetic stirrer, and a nitrogen shroud. Phenylsilanetriol (Wacker-Chemie No. SY-430, 0.74 mole, 98.8 grams) was dissolved in 440 grams mixed xylenes in the flask. Tetraethylorthosilicate (0.185 mole, 38.5 grams) was mixed with 20 grams of mixed xylenes and added to the flask. Aqueous HCl (0.01N, 6.66 grams) was dissolved in 80 grams isopropanol and 60 grams mixed xylenes and was added to the flask. The solution was heated to gentle reflux for two hours. After cooling to 25° C., the solution was washed with two 250 millimeter portions of distilled, deionized water. The solution was reheated to vigorous reflux and 125 milliliters of distillate was removed. After cooling to 25° C., an isopropanol/mixed xylene solution (80 grams/80 grams) of phenylphosphonic acid (0.025 mole, 4.0 grams) and triisopropyl borate (0.050 mole, 9.4 grams) was added. The solution was gently refluxed for two hours. The solution was further heated while removing the distillate until the vapor temperature reached 138° C. Reflux was continued for one hour and the solution was allowed to cool. A sample of the solution was evaporated to dryness at 140° C. and was found to be 19.6 weight percent solids. Films spun onto four inch diameter wafers showed after-cure thicknesses of 2500 Angstroms (at 10,000 rpm) to 6500 Angstroms (at 2000 rpm).

EXAMPLE 4

Variations in the Phenylsilanetriol/Tetraethylsilicate Ratio

In the manner described in Example 3, a series of interlayer dielectric solutions were prepared by varying the weight ratios of phenylsilanetriol (referred to as "Triol" in the Table below) to tetraethylorthosilicate (TEOS), all at approximately a 25 weight percent solids level in mixed xylenes. Films of these solutions were spun onto silicon wafers (6000-9000 Angstroms thick) and cured at 350° C. for 20-25 minutes in a belt furnace (INTEX brand, Model J). Film thicknesses were measured by ellipsometry, the wafers were soaked in acetone for two minutes and the thicknesses were remeasured:

| Triol/TEOS Ratio | Init. Thickness (Angstroms) | Fin. Thick. (Angstroms) | % Lost |
|---|---|---|---|
| 100/0 | ~7000 | <100 | ~100 |
| 95/5 | 5813 | 497 | 91 |
| 90/10 | 5623 | 4865 | 13 |
| 85/15 | 7694 | 7168 | 6 |
| 80/20 | 7147 | 6969 | 3 |
| 75/25 | 9372 | 9244 | 1 |
| 70/30 | ~7000 | ~7000 | ~0 |

We claim:

1. A semiconductor device which comprises, as a dielectric insulating layer, a cured polymeric composition formed by the condensation of an aryl-group containing trifunctional silane comprising three groups capable of condensation with a tetrafunctional silicon compound of the formula $Si(Y)_4$, where Y is selected from the group consisting of alkoxy and halogen.

2. A device as claimed in claim 1 where the trifunctional silane is of the formula $ArSiZ_3$ where Ar is a substituted or unsubstituted phenyl group and Z is selected from the group consisting of halogen and hydroxy and where the tetrafunctional silicon compound is a tetraalkyl orthosilicate.

3. A device as claimed in claim 1 where the trifunctional silane is phenyltrichlorosilane.

4. A device as claimed in claim 1 where the trifunctional silane is phenylsilanetriol.

5. A device as claimed in claim 2 wherein the tetraalkyl orthosilicate is ethyl silicate.

6. A process for forming polymer compositions by the hydrolysis and condensation of a compound (a) of the formula $ArSiZ_3$, where Ar is an unsubstituted or substituted phenyl group and z is selected from the group consisting of halogen, alkoxy and hydroxy with a compound (b) of the formula $SiY_4$, where Y is selected from the group consisting of alkoxy and halogen, and with a compound (c) selected from the group consisting of $Ar_xM(O)(OR_y)$ and $Ar_xM(OR)_y$, where Ar is phenyl, where M is selected from the group consisting of boron and phosphorus, R is selected from the group consisting of hydrogen and alkyl, and where x is 0 to 2 and y is 3 to 1 when M is phosphorus and x is 0 or 1 and y is 3 or 2 when M is boron.

7. A process as claimed in claim 6 where the mole ratio of compound (a) to compound (b) is from about 3:1 to about 6:1.

8. A process as claimed in claim 6 wherein compound (a) is selected from the group consisting of phenyltrichlorosilane and phenylsilanetriol and compound (b) is ethyl silicate.

9. A process as claimed in claim 6 wherein compound (c) is selected from the group consisting of phenylphosphonic acid and triisopropylborate.

* * * * *